(12) United States Patent
Yin

(10) Patent No.: US 6,229,829 B1
(45) Date of Patent: May 8, 2001

(54) FOURTH HARMONIC GENERATION APPARATUS

(75) Inventor: Yusong Yin, Bohemia, NY (US)

(73) Assignee: Photonics Industries International, Inc., Bohemia, NY (US)

( * ) Notice: Subject to any disclaimer, the term of this patent is extended or adjusted under 35 U.S.C. 154(b) by 0 days.

(21) Appl. No.: 09/362,848

(22) Filed: Jul. 28, 1999

Related U.S. Application Data

(63) Continuation-in-part of application No. 09/277,394, filed on Mar. 26, 1999, now Pat. No. 6,061,370.

(51) Int. Cl.$^7$ ...................................................... H01S 3/10
(52) U.S. Cl. .............................. 372/22; 372/98; 372/92
(58) Field of Search ................................. 372/22, 98, 92, 372/21, 100, 27

(56) References Cited

U.S. PATENT DOCUMENTS

| | | | |
|---|---|---|---|
| 5,898,717 | * | 4/1999 | Yin ........................................ 372/22 |
| 5,936,983 | * | 8/1999 | Yusong et al. ...................... 372/22 |
| 6,061,340 | * | 5/2000 | Yin ........................................ 372/22 |
| 6,078,598 | * | 6/2000 | Ohtsuki et al. ...................... 372/22 |

\* cited by examiner

Primary Examiner—Leon Scott, Jr.

(74) Attorney, Agent, or Firm—James A. Quinton, Esq

(57) ABSTRACT

A fourth harmonic frequency generating method and apparatus is provided. The system includes within the optical cavity an active laser medium, a second harmonic generator for generating second harmonic frequency of the fundamental frequency emitted by the laser. The fundamental beam is directed to a second harmonic generation crystal where a portion of the fundamental beam is converted to a second harmonic beam. Both the second harmonic and unconverted fundamental beams are directed back across the second harmonic generator by reflective surfaces for a second pass prior to any conversion of second harmonic beam to a higher harmonic beam. Preferably the second harmonic and fundamental beams are reflected by one of the laser cavity reflective surfaces for the second pass. Optionally, there can be separate reflective surfaces to reflect each of the fundamental and second harmonic beams. A third harmonic generator for generating third harmonic frequency of the fundamental frequency, a fourth harmonic generator for generating a fourth harmonic frequency of the fundamental frequency and a wavelength selective coupling to facilitate the removal of the fourth harmonic beam from the optical cavity are provided in optical communication with the reflected second harmonic and fundamental beam. Optionally the unconverted second harmonic beam can be directed through the laser medium as additional pumping. Optionally substantially all UV beams are removed from the laser cavity. The resulting laser has improved conversion efficiency and an improved mode quality.

20 Claims, 3 Drawing Sheets

FOURTH HARMONIC GENERATION APPARATUS

This application is a contiuation-in-part of Ser. No.: 09/277,394 filed on Mar. 26, 1999 now U.S. Pat. No. 6,061,370.

FIELD OF THE INVENTION

The field of the invention concerns a frequency quadrupled laser, and in particular a method and apparatus for generating a fourth harmonic beam.

BACKGROUND OF THE INVENTION

Optical harmonic generation using a non-linear medium such as a crystal, provides a method for doubling, tripling or quadrupling of the frequency of electromagnetic radiation emitted by a laser or other high intensity source. Harmonic generation and optical parametric oscillation have been demonstrated in crystals such as LiNbO, KDT, KTP, BBO, LBO and others. Blue, green and UV lasers have found industrial, medical and scientific applications.

UV lasers are used in drilling, microwelding and the like. Intracavity fourth harmonic generation has been suggested. See Tso Yee Fan and Bruce H. T. Chai, "Intracavity Fourth Harmonic Generation Using Three Pieces of LBO in a Nd:YAG Laser", *OSA Proceeding on Advanced Solid State Lasers* 1994 Vol. 20, pps. 377–380. However, such prior art fourth harmonic lasers are lower powered in the order of about 270 mw of fourth harmonic power. Other fourth harmonic lasers have been proposed see U.S. Pat. No. 5,206,868. There still exists a need for improved high powered fourth harmonic lasers.

SUMMARY OF THE INVENTION

According to the invention a fourth harmonic frequency generating method and apparatus is provided. The system includes within the optical cavity an active laser medium, a second harmonic generator for generating second harmonic frequency of the fundamental frequency emitted by the laser. According to the invention, fundamental beam is directed to a second harmonic generation crystal where a portion of the fundamental beam is converted to second harmonic beam. Both the second harmonic and unconverted fundamental beams are directed back across the second harmonic generator by reflective surfaces for a second pass prior to any conversion of second harmonic beam to a higher harmonic beam. Preferably the second harmonic and fundamental beams are reflected by one of the laser cavity reflective surfaces for the second pass. Optionally, there can be separate reflective surfaces to reflect each of the fundamental and second harmonic beams. A third harmonic generator for generating third harmonic frequency of the fundamental frequency, a fourth harmonic generator for generating a fourth harmonic frequency of the fundamental frequency and a wavelength selective coupling to facilitate the removal of the fourth harmonic beam from the optical cavity are provided in optical communication with the reflected second harmonic and fundamental beam. Optionally the unconverted second harmonic beam can be directed through the laser medium as additional pumping. In another aspect of the invention substantially all UV beams are removed from the laser cavity preferably 99% or greater. A UV beam separator is desirably provided between the fourth harmonic generator and the laser medium. The UV beam separator can be a separating mirror or a prism. Desirably, the UV beam separator is a prism for separating unconverted fundamental beam from UV third and fourth harmonic beam. The resulting laser has improved conversion efficiency and an improved mode quality.

Fourth harmonic output of Nd:YAG or Nd:YLF or Nd:YVO$_4$ is desirable in some applications such as in small hole drilling on multilayer circuit boards. The fourth harmonic wavelength is one fourth of its fundamental wavelength. The focus ability is proportional to the wavelength. What this means is the shorter the wavelength, the smaller the spot size to which the beam can be focused. In addition to its better focus ability, the higher photon energy of the fourth harmonic tends to have better interaction in certain material processing applications.

Useful in this invention are a type I and type II preferably type I phase matching crystal for second harmonic generation and type I or type II phase preferably type II matching crystal for third harmonic generation and a type I or type II preferably type I phase matching crystal for the fourth harmonic generation. In a type I phase matching crystal for a second harmonic generation, the polarization orientation of the fundamental beam is orthogonal to the one of the second harmonic beam. In a type II phase matching crystal for third harmonic generation, the polarization orientations of fundamental beam and second harmonic beam are orthogonal. Resulting polarization orientation of the third harmonic beam is parallel to the polarization orientation of one of two input beams (for example in a type II LBO crystal the polarization of the fundamental beam and the third harmonic beam will be parallel).

In a type I LBO fourth harmonic crystal, both the fundamental and third harmonic beam polarization orientations are parallel.

It is an object of the invention to provide efficient intracavity generation of optical fourth harmonic frequency of light or radiation, using several nonlinear crystals or other conversion means positioned within the optical cavity containing the active laser medium.

It is an object of the invention to provide laser frequency quadrupling apparatus by using LBO nonlinear crystals within the laser cavity.

It is an object of the invention to provide frequency quadrupling apparatus with a high conversion efficiency (quadrupled output power/total fundamental output power).

It is an object of the invention to provide high output of quadrupled frequency beam in ultraviolet.

It is further object of the invention to remove substantially all the fourth harmonic beam from the laser cavity.

A further object of the invention is to provide a fourth harmonic beam with improved mode quality.

A further object of the invention is to remove substantially all UV radiation from the laser cavity before it come in contact with the lasing medium.

Other and further objects will become apparent from the specifications, drawings and claims.

The preferred embodiment of the represent invention is illustrated in the drawings an examples. However, it should be expressly, understood that the present invention should not be limited solely to the illustrative embodiment.

DETAILED DESCRIPTION OF THE INVENTION

Figure 1:
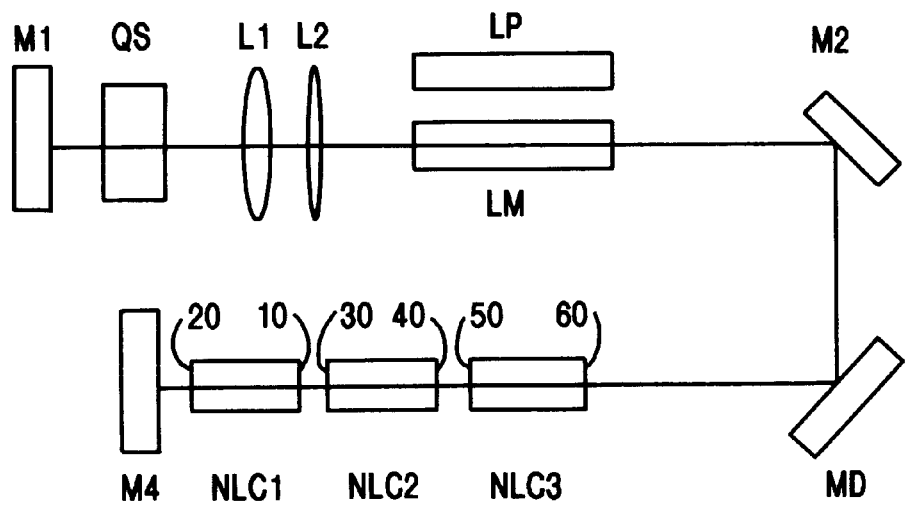
FIG. 1 is a diagrammatic view of a laser according to the invention.

According to the invention, a frequency quadrupled laser is provided which includes first and second reflective surfaces preferably highly reflective, which form an optical resonator cavity. An efficient intracavity fourth harmonic frequency generating laser is provided with an improved conversion efficiency and improved mode quality. A laser medium preferably a solid state laser medium is located within the optical resonator cavity to generate a fundamental beam of electromagnetic radiation having a preselected wavelength propagating from the front and back ends of the laser medium. A second harmonic LBO crystal(cut for either critical phase matching or non-critical phase matching) located within the optical resonator cavity is provided for converting a portion of the fundamental beam to a second harmonic beam. A type II frequency tripling LBO nonlinear crystal(cut for critical phase matching) is also located within the laser resonator cavity. The fundamental frequency beam from the laser is directed through the type I frequency doubling crystal within the optical cavity. As a result a portion of the fundamental beam is converted to second harmonic beam. The fundamental and second harmonic beams are reflected back through the type I crystal where the fundamental beam is again partially converted to second harmonic beam prior to any conversion of the second harmonic beam to higher harmonic beam. The resulting fundamental and second harmonic beams are then directed to a type II frequency tripling LBO nonlinear crystal which converts a portion of the fundamental beam and a substantial portion of the second harmonic beam to a third harmonic frequency when both fundamental and second harmonic beams propagate through the frequency tripling crystal. The third harmonic beam and the unconverted fundamental beam are then directed across a type I fourth harmonic LBO crystal cut for critical phase matching where a portion of the fundamental beam and a portion of the third harmonic beam are converted to a fourth harmonic frequency when both fundamental and third harmonic beams propagate through the frequency quadrupling crystal. The resulting beams which are the fundamental, second harmonic, third harmonic and fourth harmonic are then directed to a fourth harmonic separator in which the fourth harmonic beam is separated from the fundamental beam and directed outside the optical resonator cavity as the output of the laser. The fundamental beam is then directed back through the laser medium for amplification. Optionally both the fundamental and the unconverted second harmonic beams can be directed back through the laser medium to increase its efficiency. A reflective surface is provided at the back end of the laser medium to reflect the fundamental beam back to the laser medium for further amplification.

In another aspect of the invention UV radiation is removed from the laser cavity prior to any contact by the UV beam with the laser medium. UV beams can be very destructive to laser medium and particularly to laser crystals. Nd:YVO$_4$ crystals are particularly sensitive. Thus, it is desirable to separate UV beams from the fundamental beam prior to the return of the fundamental beam to the laser medium. A UV beam separator is desirably provided between the fourth harmonic generator and the laser medium. The UV beam separator can be a separating mirror or a series of separating mirrors. Preferably a prism most preferably a dispersion prism which efficiently separate the fundamental beam from fourth or third harmonic beam is provided. Optionally a combination of prisms and mirrors can be provided. The fourth harmonic separator and the UV separator can be combined. In the laser according the invention the third harmonic and fourth harmonic beams are UV beams. The combined fourth harmonic separator and UV separator can be for example a dichroic mirror which is highly reflective for both fourth harmonic and third harmonic beams. Optionally a prism or pair of prisms or multiple prisms can be provided to spatially separate fourth harmonic beam and third harmonic beam from fundamental beam as shown for example in FIG. 2.

Referring now to FIG. 1, a fourth harmonic laser is provided. A lasing medium LM is provided within the laser resonator cavity. A number of different lasing mediums, preferably laser crystals, can be used for example Nd:YLF, Nd:YAG, Nd:YVO$_4$. A laser pump LP for example a lamp, laser diodes or another laser is provided to energize the lasing medium. Mirror M1 and M4 are provided to define the optical resonator cavity. Optionally, a Q switch QS can be provided in the event a pulsed laser output is desired instead of a continuous wave output. Optionally, spherical lens L2 and cylindrical lens L1 are provided particularly with a Nd:YLF crystal. The cylindrical lens compensates for thermal lensing characteristics of the crystal particularly of a Nd:YLF crystal. In the Q switch option, the lasing is held off by introducing a loss into the resonator cavity while energy is pumped into and stored in the atomic population inversion. Once desired inversion is attained, cavity losses are reduced to allow lasing. In this mode, it is possible to produce large pulse chain output from the laser. Mirror M1 is a high reflector mirror for the fundamental frequency of the lasing medium LM. The laser medium is selected to generate a laser beam at a preselected fundamental frequency along a common axis 1. Optionally as shown in FIG. 1 the optical axis can be unshaped. A beam propagates from both the front end of the laser medium and from the back of the laser medium towards Mirror M1. For example a Nd:YLF laser medium can be used which emits a beam having a wavelength of 1053 nm. According to the invention, second harmonic beam having a wavelength of 527 nm and third harmonic beam in the UV spectrum having a wavelength of 351 nm and a fourth harmonic beam in the UV spectrum having a wavelength of about 263 nm will be produced.

A mirror M2 which is a high reflector for the fundamental frequency of the laser medium LM and optionally a high reflector for the second harmonic frequency is provided in optical communication with output from the front end of the lasing medium, LM. Desirably mirror M2 is a folding mirror. A mirror MD is provided in optical communication with M2. MD is a high reflector for beams having the preselected fundamental frequency and high transmission for fourth harmonic frequency beam. Desirably MD is a dichroic mirror. Optionally MD is also a high reflector for second harmonic beam. Optionally, MD transmits desirably highly transmits the second and/or third harmonic beams outside the cavity along with the fourth harmonic beam. A type I LBO fourth harmonic crystal NLC3 is provided in optical communication with the beam reflected by mirror MD. The beam propagating through crystal NLC3 is directed to crystal NLC2 which is a type II lithium triborate crystal (LBO). Third harmonic generator NLC2 is in optical communication with the beam propagating from NLC3. The beam propagating through NLC2 is directed to a type I nonlinear crystal NLC1 for second harmonic generation preferably a type I LBO crystal. In NLC1 a portion of the fundamental beam is converted to the second harmonic beam. The beams propagating from NLC1 are directed to mirror M4, which is a high reflector for both fundamental and second harmonic beams.

In operation, the fundamental beam from the laser medium LM is reflected by M1 and amplified by LM along the fundamental beam optical axis. The beam then incidents on mirror M2. M2 preferably reflects vertical polarized fundamental beam to Mirror MD and transmits horizontal polarized fundamental beam. As a result vertical polarized beams are favored and horizontal polarized beams are discouraged. Thus laser LM lases at vertical polarization. Optionally M2 can reflect horizontally polarized fundamental beam and transmit vertically polarized fundamental beam. The laser medium will then lase at horizontal polarization. Mirror MD directs the reflected fundamental beam from Mirror M2 to fourth harmonic generator NLC3 which does not affect the fundamental beam in the absence of third harmonic beam. The fundamental beam passing through NLC3 is directed to third harmonic generator NLC2 which does not affect the fundamental beam in the absence of second harmonic beam. The fundamental beam passing through NLC2 is directed through second harmonic generator NLC1. The fundamental beam enters NLC1 at EMR port 10 and exits through EMR port 20. A small portion of the fundamental beam (beam 1) converts to the horizontal polarized second harmonic beam (beam 2) through NLC1 by meeting its phase matching condition ($K(2w)=K(w)+K(w)$ either through adjusting the orientation of the crystal or adjusting the temperature of the crystal. Both fundamental beam 1 and second harmonic beam 2 propagate toward the mirror M4 and are reflected back from M4. When the beam 1 passes through the NLC1 by entering EMR port 20 on reflection from the Mirror M4, another small portion of the fundamental beam converts to its second harmonic beam which is combined with the reflected second harmonic beam 2 to form a combined second harmonic beam 2 which exits from NLC1 through EMR port 10 and is directed to EMR port 30 in NLC2. The crystal NLC2 converts a portion of fundamental beam 1 and a substantial portion of second harmonic beam 2 propagating from NLC1 into the vertical polarized third harmonic beam (beam 3) under the satisfaction of phase matching condition $K(3w)=(K(w)+K(2w)$. The beams 1, 2, 3 exit NLC2 through EMR port 40 and are directed to EMR port 50 in crystal NLC3. Beam 3 which is third harmonic and beam 1 which is fundamental exits NLC2 with polarization orientations parallel one to the other and propagate across NLC3 in which a portion of the fundamental and a portion of the third harmonic beams are converted to horizontal polarized fourth harmonic beam (beam 4)under the satisfaction of phase matching condition $K(4\omega)=K(\omega)+K(3\_\omega)$. The beams 1, 2, 3 and 4 then exits NLC3 through EMR port 60 and are then directed to a beam separator MD. Separator MD removes fourth harmonic beam, optionally third harmonic beam from the cavity, and reflects beam 1, optionally beam 2 toward Mirror M2. Optionally, beams 2 and 3 that is the second harmonic and third harmonic can be removed together with the fourth harmonic beam from the cavity. The fundamental beam 1 reflected back from Mirror M2 is amplified by the laser Medium LM. Optionally Mirror M2 is reflective for second harmonic beam. Thus, beam 2 is reflected back from M2 and pumps LM to increase pumping efficiency in certain cases. The beam spot size on the crystal NLC1, NLC2 and NLC3 is desirably one half or less than the diameter of the crystal. The resulting laser has an improved efficiency compared with prior art. The mode quality is also improved compared with traditional external fourth harmonic generation by BBO crystal. The overall conversion efficiency is calculated by dividing the fourth harmonic frequency output power by total fundamental frequency output power under the condition of no second harmonic frequency, third or fourth harmonic frequency generations. For example typically a prior art Nd:YLF laser produces total 8 watts average power at the fundamental frequency at Q-switched 1000 Hz repetition rate at 150 nanosecond pulse width. With traditional external fourth harmonic generation method by BBO crystal, the fourth harmonic output power at 263 nm is about 1 watt with extremely distorted elliptical beam (elliptical ratio 3.5:1) with the conversion efficiency of 12.5%. Using another prior art described by Tso Yee Fan and Bruce Chai et al., 0.8 Watts at 263 nm fourth harmonic beam was generated with the conversion efficiency of 10%. With the configuration of the invention, 2.2 Watts at 263 nm fourth harmonic beam was generated with excellent beam quality at the conversion efficiency of 27.5%.

Figure 2:
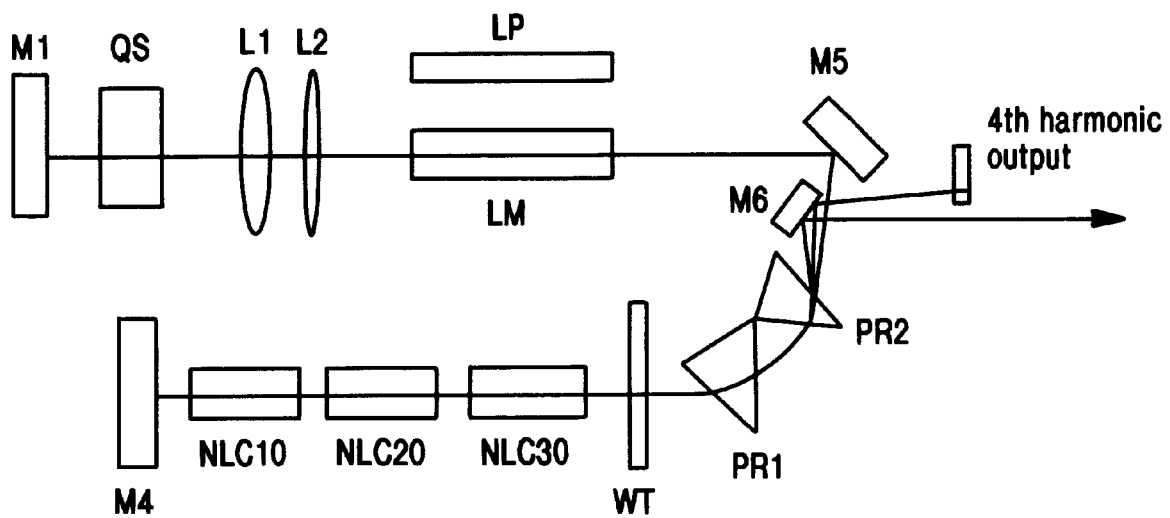
FIG. 2 is a diagrammatic view of an alternative embodiment of the laser according to the invention.

Referring to FIG. 2, an alternative embodiment of a laser according to the invention in which a pair of prisms PR1 and PR2 preferably UV graded fused silica prisms are used to separate the fourth harmonic beam from the fundamental beam is shown. The fundamental beam preferably lases at horizontal polarization. The fundamental beam from laser medium LM is directed to Mirror M5 that is a high reflector for fundamental beam. The fundamental beam is reflected to Prism PR1 and PR2, which deflect the fundamental beam, and directs it to NLC30. The fundamental beam incidents on and exits from both PR1 and PR2 prisms at or near Brewster's angle. So the 'P' polarization of the fundamental beam will experience minimum loss through PR1 and PR2. The 'S' polarization will experience substantial loss as the beam passes through these prisms. As the result, the laser lases at horizontal polarization. The beam passes through NLC30, NLC20, NLC10 and is reflected by Mirror M4 as described regarding to FIG. 1 except that polarizations of beam 10, beam 20, beam 30 and beam 40 (fundamental, second, third and fourth harmonic) are horizontal, vertical, horizontal and vertical. Optionally, a polarization rotator such as a waveplate(WP) is inserted between NLC30 and fourth harmonic beam separator PR2 and PR1. The polarization rotator rotates polarization half wave (90 degrees) at fourth harmonic at 263 nm and multi full wave at the fundamental at 1053 nm. The net effect from the polarization rotator is that it rotates the polarization of fourth harmonic beam from vertical polarization when it propagates from NLC30 to horizontal polarization after it passes through the polarization rotator, fundamental beam polarization will remain the same, horizontal polarization. The fundamental, second, third and fourth harmonic beams then enter and exit prism PR2 at or near Brewster angle where the beams are displaced from one to another. The fundamental and fourth harmonic beams will experience minimum losses since both beams are horizontal or 'P' polarized with the incident angle at or near Brewster angle. The displaced beams enter and exit prism PR1 at or near Brewster angle which increases the displacement among the beams. The fundamental beam leaving PR1 is directed to mirror M5 and reflected back to LM for amplification. The second, third and fourth harmonic beams are directed to Mirror M6 which is reflective for fourth harmonic, optionally for third harmonic and second harmonic beam preferably highly reflective and reflects the beams outside the laser cavity. Preferably beam block B1 is provided to block either the second harmonic or third harmonic or both beams from the output.

Figure 3:
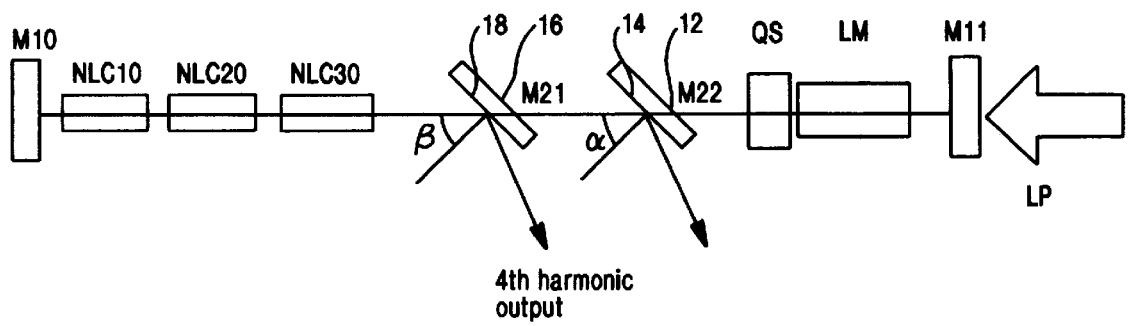
FIG. 3 is a diagrammatic view of another alternative embodiment of the laser according to the invention.

FIG. 3 is an alternative embodiment of a fourth harmonic laser according to the invention. In FIG. 3, a laser cavity is provided between reflecting surfaces preferably highly reflective mirrors M10 and M11. Laser medium desirably Nd:YAG, Nd:YLF or Nd:YVO$_4$ crystals are provided within the cavity. For the example of in FIG. 3, a Nd:YAG lasing crystal is used. An optional Q-switch QS is provided in the cavity. The laser medium is excited by imputing energy desirably by an end pumping diode source LP. An optical axis is provided between cavity mirrors M10 and M11. The Nd:YAG crystal lases at a fundamental frequency of 1064 nm. Beam separator desirably dichroic mirror M21 and optionally dichroic mirror M22 are provided along the optical axis. Fourth harmonic generator, particularly a fourth harmonic nonlinear crystal NLC30 such as a fourth harmonic type I LBO crystal is provided within the cavity formed between mirrors M10 an M11 along the optical axis. A third harmonic generator, such as a third harmonic crystal NLC20 for example an LBO type II nonlinear crystal is provided between the fourth harmonic generator NLC30 and mirror M10. A second harmonic generator NLC10 located along the optical axis between M10 and M11 is provided between the third harmonic crystal NLC20 and reflecting surface M10.

Beam separator, desirably dichroic mirror M21 is highly transmissive at 1064 nm (fundamental beam) on side 16 and 18 and highly reflective at 266 nm (fourth harmonic) on side 18. Optional dichroic mirror M22 is highly transmissive at 1064 nm (fundamental beam) on side 12 and 14 and highly reflective at 266 nm (fourth harmonic beam) on side 14. Optionally, M21 may be highly reflective for third harmonic beam (355 nm) on side 18 in which instance the third harmonic and the fourth harmonic will be removed together as the output of the laser. Optionally, when the third and fourth harmonic are both removed by M21, the third and fourth harmonic can be separated outside the cavity. Mirror M21 may also be optionally highly transmissive to third harmonic beam (355 nm) on side 18. Mirror M22 is highly transmissive for fundamental beam, 1064 nm and highly reflective for fourth harmonic beam (266 nm) on side 14 of mirror M22. Optionally mirror M22 may be highly reflective for third harmonic beam (355 nm) on side 14 of mirror M22, particularly in cases where the user desires separate fourth and third harmonic output beams. In such cases, mirror M21 will be highly transmissive for third harmonic on side 18 and M22 will be highly reflective for third harmonic on side 14. Preferably mirror M21 and M22 are located at or near the Brewster angle β and α respectively to the optical axis, for fundamental beam.

In operation the Nd:YAG crystal lases at 1064 nm. The beam passes along the optical axis, and it is highly transmitted at P-polarization by mirror M22 which is preferably located at or near the Brewster angle α to the optical axis for the fundamental frequency. Optionally mirror M22 can be coated on side 12 to transmit at fundamental beam (1064 nm). Mirror 21 is also preferably located at or near the Brewster angle β for the fundamental beam to the optical axis so that fundamental beam at P-polarization is highly transmitted. As a result P polarization will be favored in the laser cavity. Thus laser fundamental beam will lase at a P-polarization, which in the configuration of FIG. 3 would also be horizontal polarization. The fundamental beam is directed to fourth harmonic generator NLC30 which has no effect on the beam. The beam passes through the fourth harmonic generator to the third harmonic generator NLC20 which also has no effect on the fundamental beam. The beam from the third harmonic generator then passes through the second harmonic generator which converts a portion of the fundamental beam to a second harmonic beam. The second harmonic beam and the fundamental beam propagating from the second harmonic generator are then reflected by reflective surface M10 for a second pass through the second harmonic generator where additional second harmonic beam is generated. The second harmonic and fundamental beam are then directed across the third harmonic generator where third harmonic beam is produced. The three beams propagating from the third harmonic generator NLC20 that is the fundamental, second harmonic and third harmonic beams are then directed to the fourth harmonic generator NLC30 where a portion of the fundamental and a portion of third harmonic beam are converted to fourth harmonic beam. The beams propagating from the fourth harmonic generator NLC30 are then directed to the dichroic mirror M21 which reflects the fourth harmonic and optionally the third harmonic beam outside the cavity. Fundamental beam is transmitted by mirror M21 along the optical axis for ultimate return to the laser medium for amplification. Any unreflected third or fourth harmonic beam that is transmitted through M21 incidences on optional mirror M22 which is highly reflective for fourth harmonic and third harmonic beam. As a result, a substantially portion of the UV radiation remaining in the cavity is removed (both the third and fourth harmonic are in the UV range). Preferably substantially all the UV radiation is removed (99% or greater) Removal of UV beams is desirable as UV radiation can be destructive to the lasing crystal or coatings such as the Nd:YAG and/or the Q-switch or coated mirrors.

Figure 4:
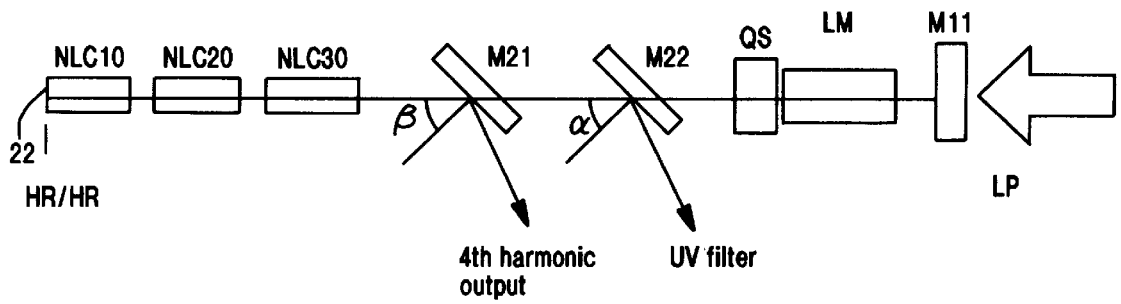
FIG. 4 is a diagrammatic view of further alternative embodiment of the laser according to the invention.

FIG. 4 is an alternative embodiment of the invention. FIG. 4 is similar to FIG. 3 except the second harmonic generator has a high reflective coating 22 on its outlet port to function as a reflective surface. Thus, the second harmonic and fundamental beams exiting the second harmonic generator are reflected back across the crystal at the point of exit which is a reflective surface. As a result, the second cavity reflective surface is provided by the coated EMR port of NLC10.

Figure 5:
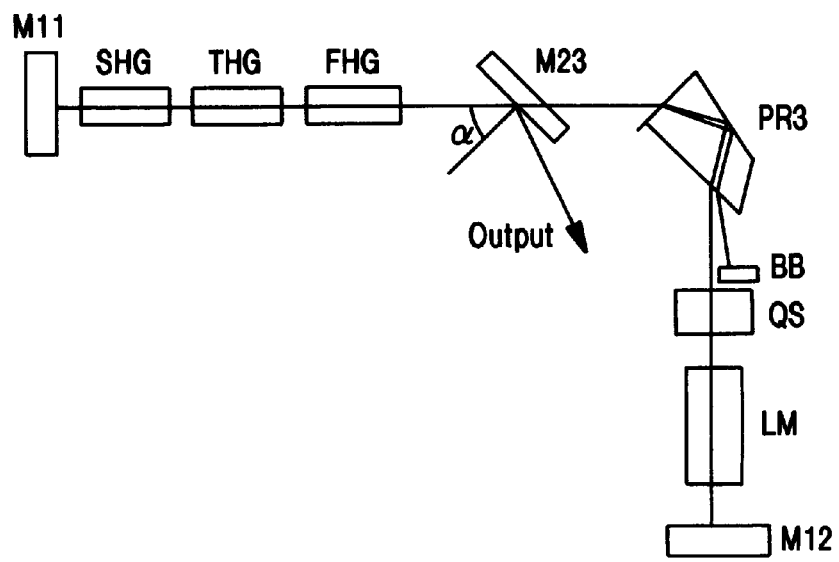
FIG. 5 is a diagrammatic view of further alternative embodiment of the laser according to the invention.
Figure 6:
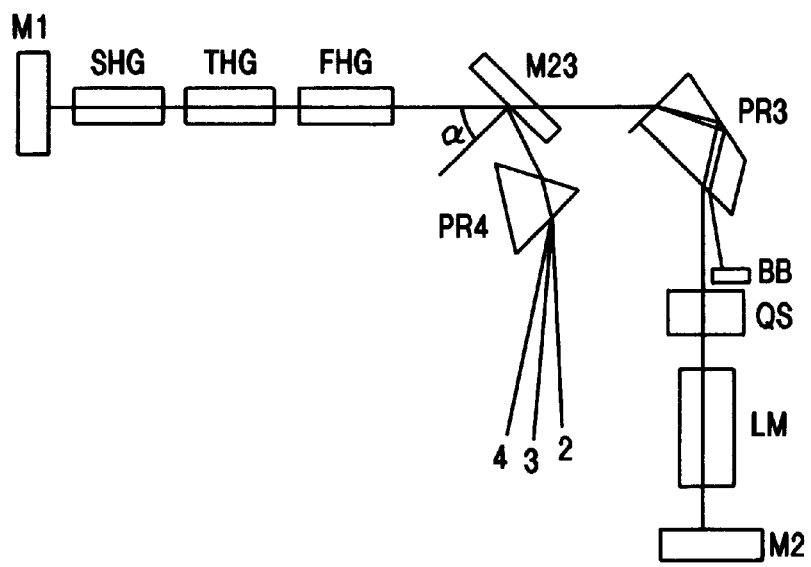
FIG. 6 is a diagrammatic view of further alternative embodiment of the laser according to the invention.

FIGS. 5 and 6 are alternative embodiments of the subject invention which include a UV separator and in particular UV separating prisms in addition to a fourth harmonic separator. The laser medium LM in FIG. 5 and FIG. 6, can be any laser medium sensitive to UV for example Nd:YAG, Nd:YLF or Nd:YVO$_4$. Desirably the embodiment of FIGS. 5 and 6 are used in connection with Nd:YVO$_4$ laser medium preferably a laser crystal. It is important that the UV radiation be removed from the cavity prior to the fundamental beam being returned to the laser medium for amplification. In FIG. 5 a laser cavity is formed between mirrors M11 and M12. Mirror M12 is highly reflective for fundamental beam. Mirror M11 is highly reflective for fundamental and second harmonic. Laser medium LM, preferably a Nd:YVO$_4$ Nd:YAG, Nd: YLF or Nd:YAP crystal is provided between mirrors M11 and M12. An optional q-switch QS is provided to allow q-switch operation of the device. A fourth harmonic separator desirably an output coupler, preferably dichroic mirror M23 which transmits fundamental beam in both directions and reflects fourth harmonic beam propagating from the fourth harmonic generator is provided. Such an output coupler M23 can transmit a significant amount of third and second harmonic beam depending on the coating applied to mirror M23.

As best seen in the FIG. 5, according to the invention a UV separator is provided between the fourth harmonic beam separator M23 and the laser medium LM. Desirably the UV separator is a mirror highly reflective for fourth and third harmonic beam or preferably a prism optionally two or more prisms preferably a dispersion prism PR3 for displacing the various harmonic beams from one another. Dispersion prisms separate beams of differing wavelength into spatially separated beams. Useful are for example Pellin Broca dispersion prisms which can change the direction of a preselected wavelength beam about 90 degrees. The polarization of the beam relative to the prism PR3 should be selected to minimize the loss of fundamental beam. Thus, it is preferred that the fundamental beam be at P polarization to the prism PR3.

Within the laser cavity, three nonlinear crystals are provided. Between mirror M23 and mirror M11, a fourth harmonic crystal FHG is provided. Between fourth harmonic nonlinear crystal FHG, and mirror M11, a third harmonic crystal THG is provided. Between to the third harmonic crystal THG and mirror M11 a, second harmonic crystal SHG is provided. The second harmonic crystal should be the crystal nearest mirror M11 and the fourth harmonic crystal should be nearest mirror M23 with the third harmonic crystal THG located between FHG and SHG. Desirably the second, third and fourth harmonic crystals are LBO crystals.

In operation the laser medium LM lases. The fundamental beam is directed to prism PR3 where it is directed to dichroic mirror M23, which is highly transmissive for fundamental beam in both directions. The fundamental beam then passes through mirror M23 where it incidents on fourth harmonic generator FHG. Since fourth harmonic generator FHG will only affect the fundamental beam in the presence of third harmonic beam where phasing matching conditions are met, the fundamental beam passes through FHG unaffected. The fundamental beam is then directed to third harmonic generator THG which only affects fundamental beam in the presence second harmonic beam, where phase matching conditions are met. Thus, the fundamental beam passes through THG unaffected. The fundamental beam then passes through the second harmonic generator where a portion of the fundamental beam is converted to second harmonic beam. The fundamental and second harmonic beam then incident on mirror M11 and are reflected back across second harmonic generator where an additional portion of the fundamental beam is converted to second harmonic beam. The second harmonic and the fundamental beam then incident simultaneously on third harmonic THG where a portion of fundamental beam in the presence of second harmonic beam is converted to third harmonic beam. The third harmonic and unconverted second harmonic and fundamental beam are then directed across fourth harmonic generator where a portion of the third harmonic beam and a portion of fundamental beam are converted to fourth harmonic beam. The fundamental second, third and fourth harmonic beams are then directed to a fourth harmonic beam separator desirably dichroic mirror M23. Mirror M23 is preferably highly reflective for fourth harmonic and optionally for third harmonic as well. Mirror M23 may also be highly reflective for second harmonic or optional highly transmissive for second and/or third harmonic beams. Fourth harmonic beam is reflected by M23 outside the cavity as the output of the laser. Dichroic mirror M23 is highly reflective for fourth harmonic beam. However, even in a highly reflective mirror, some fourth harmonic beams will be transmitted through mirror M23. The fundamental beam and unreflected second and third and fourth harmonic beam are directed to prism PR3. The fundamental beam is separated in prism PR3 from substantially all the second, third and fourth harmonic beams. Prism PR3 will separate the different wavelength beams spatially. Thus the fundamental beam will be separated from the second, third, and fourth harmonic beams. A beam blocker BB is provided for receipt of third and fourth harmonic beams which are UV beams. As a result, substantially all the UV beams are separated from the fundamental beam. Thus UV damage to the laser medium can be avoided.

FIG. 6 is similar to FIG. 5 except an additional prism PR4 is provided. In this embodiment mirror M23 is highly reflective for fourth, third and second harmonic beam. Desirably the output of the beam is separated into fourth, third and second harmonic beams by prism PR4. The second and third harmonic beams can be directed to a beam blocker or used as additional laser outputs.

The foregoing is considered as illustrative only to the principles of the invention. Further, since numerous changes and modification will occur to those skilled in the art, it is not desired to limit the invention to the exact construction and operation shown and described above, and accordingly, all suitable modifications and equivalents may be resorted to, falling within the scope of the invention.

What is claimed is:

1. A laser for producing a fourth harmonic beam comprising;

a) a first reflective surface and a second reflective surface to form an optical resonator cavity therebetween; said optical resonator cavity having an optical axis between said first and second reflective surfaces;

b) a laser medium located within said cavity for generating a fundamental frequency beam of electromagnetic radiation (EMR) having a first preselected wavelength propagating from the front end and the back end of said laser medium;

c) a second harmonic generator for converting a portion of said EMR of said first preselected fundamental frequency beam to a second harmonic beam in optical communication with said front end of said laser medium;

d) said second harmonic generator having a first EMR port for receiving and directing radiation through said generator and a second EMR port for receiving and directing radiation through said generator whereby radiation will enter said first EMR port, propagate through said generator and exit said second EMR port and vise versa;

e) means to direct said fundamental beam to said first EMR port;

f) means to direct said fundamental beam propagating from said second ERM port to said second reflective surface and said second harmonic beam propagating from second EMR port to a second harmonic reflective surface so that said fundamental and said second harmonic beams are reflected to said second EMR port for propagation back through said second harmonic generator nonlinear crystal to produce additional second harmonic beam prior to any conversion of second harmonic beam to a higher harmonic beam;

g) means to direct the EMR propagating from said first EMR port to a third harmonic generator;

h) said third harmonic generator having a third EMR port for receiving and directing radiation through said generator and a fourth EMR port for receiving and directing radiation through said generator whereby radiation will enter said third EMR port, propagate through said generator and exit said fourth EMR port and vise versa whereby a portion of the fundamental and a portion of second harmonic beam are converted to a third harmonic beam;

i) means to direct the EMR propagating from said fourth EMR port to a fourth harmonic generator;

j) said fourth harmonic generator having a fifth EMR port for receiving and directing radiation through said crystal and a sixth EMR port for receiving and directing radiation through said generator whereby radiation will enter said fifth EMR port, propagate through said generator and exit said sixth EMR port and vise versa whereby a portion of the fundamental and a portion of third harmonic beams are converted to a fourth harmonic beam;

k) a fourth harmonic beam separator in optical communication with said sixth EMR port to separate said fourth harmonic beam from said fundamental beam;

l) means to direct the separated fourth harmonic beam outside said optical resonator cavity;

m) directing means to direct said fundamental beam back through said laser medium; and n) a V/C separator to separate a uv beam from said fundamental beam prior to directing said fundamental beam back through said laser medium.

2. The laser of claim 1 wherein said laser medium is a solid state laser medium.

3. The laser of claim 2 wherein the laser medium is selected from the group consisting of Nd:YLF, Nd:YAG and Nd:YVO$_4$, Nd:YAP crystals.

4. A laser according to claim 2 wherein said fourth harmonic beam separator includes a dichroic mirror, said dichroic mirror located along the optical axis in optical communication with said sixth EMR port;

said dichroic mirror highly transmissive to fundamental frequency beam and highly reflective of fourth harmonic beam to direct fourth harmonic beam outside the cavity as the laser output.

5. The laser of claim 4 wherein said dichroic mirror is highly reflective for third harmonic beam to direct said third harmonic beam outside the cavity.

6. A laser according to claim 4 wherein said UV separator includes a uv dichroic mirror located within said optical resonator cavity along the said optical axis, between said fourth harmonic beam separator and said laser medium to receive EMR transmitted by said fourth harmonic beam separator;

said uv dichroic mirror highly reflective for fourth harmonic beam to remove additional fourth harmonic beam from the cavity.

7. The laser according to claim 6 wherein said UV dichroic mirror is highly reflective for third harmonic beam.

8. A laser according to anyone of claims 1 or 4 wherein said UV separator includes a dispersion prism located within said optical resonator cavity along said optical axis, between said fourth harmonic beam separator and said laser medium to receive EMR transmitted by said fourth harmonic beam separator mirror;

said prism producing a spacial displacement between fundamental beam, third harmonic beam and fourth harmonic beam so that substantially all uv beams are separated from said fundamental beams prior to directing said fundamental beam back across said laser medium.

9. The laser of claim 8 further comprising a Q-switch to generate a pulsed output.

10. A laser according to claim 9 wherein said second harmonic generator is a type I nonlinear crystal; said third harmonic generator is a type II nonlinear crystal; and said fourth harmonic generator is a type I nonlinear crystal.

11. The laser according to claim 10 wherein said second harmonic non-linear crystal is LBO.

12. The laser according to claim 11 wherein said third harmonic non-linear crystal is LBO.

13. The laser according to claim 12 wherein said fourth harmonic non-linear crystal is LBO.

14. The laser according to claim 4 further comprising;

said dichroic mirror highly reflective for fourth and third harmonic beam;

a dispersion prism in optical communication with reflected beams from said dichloric mirror;

said dispersion prism separating third harmonic beam and fourth harmonic beam reflected by said dichroic mirror into separate output beams.

15. The laser according to claim 1 wherein said second, third and fourth harmonic generators are nonlinear crystals.

16. The laser according to claim 1 further comprising a highly reflective coating disposed on said second EMR port of said second harmonic generator to provide said second reflective surface and said second harmonic reflective surface so that said fundamental and second harmonic beams are reflected back through said second harmonic generator by said reflective coating.

17. The laser according to claim 1 wherein said fourth harmonic beam separator and said UV separator are one or more dispersion prisms located within said optical resonator cavity along said optical axis between said fourth harmonic generator and said laser medium.

18. The laser of claim 1 wherein the fourth harmonic beam separator includes a dispersion prism for producing a displacement among the fourth harmonic beam, third harmonic, second harmonic and fundamental beam.

19. The laser of claim 18 wherein said prism is located along said optical axis at about the Brewster angle for said fundamental beam so that said laser medium produces horizontally polarized laser beam.

20. A method for producing a fourth harmonic beam comprising;

a) forming an optical resonator cavity between a first reflective surface and a second reflective surface;

b) exciting a laser medium located within said cavity to generate a fundamental frequency beam of electromagnetic radiation (EMR) having a first preselected wavelength;

c) converting a portion said fundamental frequency beam to a second harmonic beam by directing said fundamental beam across a second harmonic generator;

d) reflecting said fundamental and said second harmonic beams back across said second harmonic generator for a second pass across said second harmonic generator prior to any conversion of said second harmonic beam to a higher harmonic beam to convert additional fundamental beam to second harmonic beam;

e) directing the fundamental and second harmonic beams propagating from said second harmonic generator on said second pass to a third harmonic generator; whereby a portion of the fundamental and a portion of second harmonic beam are converted to a third harmonic beam;

f) directing EMR propagating form said third harmonic generator to a fourth harmonic generator; whereby a portion of the fundamental and a portion of the third harmonic beams are converted to a fourth harmonic beam;

g) separating fourth harmonic beam from the fundamental propagating from said fourth harmonic generator;

h) directing the separated fourth harmonic beam outside said optical resonator cavity as the laser output;

i) separating said fundamental beam from substantially all uv beam propagating from said fourth harmonic generator and returning said separated fundamental beam to the laser medium for further amplification.

* * * * *

UNITED STATES PATENT AND TRADEMARK OFFICE
CERTIFICATE OF CORRECTION

PATENT NO.    : 6,229,829 B1
DATED         : May 8, 2001
INVENTOR(S)   : Yusong Yin It is certified that error appears in the above-identified patent and that said Letters Patent is hereby corrected as shown below:

In paragraph "1", subparagraph n) should read as follows --
n) a UV separator to separate a UV beam said fundamental beam prior to directing said fundamental beam back through said laser medium.

Signed and Sealed this

Twenty-seventh Day of November, 2001

Attest:

*Nicholas P. Godici*

NICHOLAS P. GODICI
*Attesting Officer*   *Acting Director of the United States Patent and Trademark Office*